United States Patent
Yang et al.

(10) Patent No.: US 11,488,970 B2
(45) Date of Patent: Nov. 1, 2022

(54) METHOD OF FORMING SPLIT GATE MEMORY CELLS WITH THINNER TUNNEL OXIDE

(71) Applicant: Silicon Storage Technology, Inc., San Jose, CA (US)

(72) Inventors: Jeng-Wei Yang, Zhubei (TW); Man-Tang Wu, Hsinchu (TW); Boolean Fan, Hsinchu (TW); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 135 days.

(21) Appl. No.: 17/179,057

(22) Filed: Feb. 18, 2021

(65) Prior Publication Data

US 2022/0013531 A1    Jan. 13, 2022

Related U.S. Application Data

(60) Provisional application No. 63/049,775, filed on Jul. 9, 2020.

(51) Int. Cl.
  *H01L 27/11524* (2017.01)
  *G11C 16/04* (2006.01)
  *H01L 29/66* (2006.01)

(52) U.S. Cl.
  CPC .... *H01L 27/11524* (2013.01); *G11C 16/0425* (2013.01); *H01L 29/66825* (2013.01)

(58) Field of Classification Search
  CPC ........ H01L 27/11517–11548; H01L 29/42324; H01L 29/66825
  See application file for complete search history.

(56) References Cited

U.S. PATENT DOCUMENTS

| 5,029,130 A | 7/1991 | Yeh |
| 5,512,505 A | 4/1996 | Yuan |

(Continued)

FOREIGN PATENT DOCUMENTS

| TW | 544443 B | 8/2003 |
| TW | 200721510 A | 6/2007 |
| TW | 200727415 A | 7/2007 |

OTHER PUBLICATIONS

U.S. Appl. No. 16/781,798, filed Feb. 4, 2020 entitled "Method of Forming Split Gate Memory Cell With Thinned Tunnel Oxide," Kim, et al.

(Continued)

*Primary Examiner* — John A Bodnar
(74) *Attorney, Agent, or Firm* — DLA Piper LLP (US)

(57) ABSTRACT

A method of forming a memory cell includes forming a first polysilicon block over an upper surface of a semiconductor substrate and having top surface and a side surface meeting at a sharp edge, forming an oxide layer with a first portion over the upper surface, a second portion directly on the side surface, and a third portion directly on the sharp edge, performing an etch that thins the oxide layer in a non-uniform manner such that the third portion is thinner than the first and second portions, performing an oxide deposition that thickens the first, second and third portions of the oxide layer, wherein after the oxide deposition, the third portion is thinner than the first and second portions, and forming a second polysilicon block having one portion directly on the first portion of the oxide layer and another portion directly on the third portion of the oxide layer.

11 Claims, 9 Drawing Sheets

(56) References Cited

U.S. PATENT DOCUMENTS

| | | | |
|---|---|---|---|
| 5,879,993 | A | 3/1999 | Chien |
| 6,297,099 | B1 | 10/2001 | Hsieh et al. |
| 6,828,183 | B1 | 12/2004 | Sung et al. |
| 7,084,453 | B2 | 8/2006 | Chern et al. |
| 9,570,592 | B2 | 2/2017 | Do et al. |
| 2005/0085038 | A1 | 4/2005 | Tu |
| 2006/0099798 | A1 | 5/2006 | Nakagawa |
| 2006/0170029 | A1* | 8/2006 | Liu .................. H01L 27/115 257/315 |
| 2007/0042539 | A1 | 2/2007 | Jeong |
| 2007/0063251 | A1 | 3/2007 | Tu |
| 2008/0050875 | A1 | 2/2008 | Moon |
| 2009/0085090 | A1 | 4/2009 | Nagai |
| 2013/0171814 | A1 | 7/2013 | Torii |

OTHER PUBLICATIONS

Taiwanese Office Action dated Mar. 7, 2022 corresponding to the counterpart Taiwanese Patent Application No. 110122676, (See attached English translations.).

\* cited by examiner

METHOD OF FORMING SPLIT GATE MEMORY CELLS WITH THINNER TUNNEL OXIDE

RELATED APPLICATIONS

This application claims the benefit of U.S. Provisional Application No. 63/049,775, filed Jul. 9, 2020, the entire contents of which is incorporated herein by reference.

FIELD OF THE INVENTION

The present invention relates to split-gate non-volatile memory cells, and more particularly to a method of forming such cells.

BACKGROUND OF THE INVENTION

Split-gate type memory cell arrays are known. For example, U.S. Pat. No. 5,029,130, which is incorporated herein by reference for all purposes, discloses a split gate memory cell and its formation, which includes forming source and drain regions in the substrate with a channel region there between. A floating gate is disposed over and controls the conductivity of one portion of the channel region, and a control gate is disposed over and controls the conductivity of the other portion of the channel region. The control gate extends up and over the floating gate. The insulation between the floating gate and the control gate is referred to as the tunnel dielectric material (e.g. oxide), because electrons tunnel through this dielectric material during the erase operation in which a high positive voltage is applied to the control gate.

FIGS. 1A-1F show the steps in forming the split gate memory cells according to a conventional method. A silicon semiconductor substrate 10 (e.g., silicon wafer) having an upper surface 10a is provided. A layer of dielectric material (e.g. silicon dioxide, hereinafter referred to as oxide) 12 is formed on the upper surface 10a of substrate 10. A layer of polysilicon 14 is formed on oxide layer 12. A layer of silicon nitride (hereinafter referred to as nitride) 16 is formed on polysilicon layer 14, as shown in FIG. 1B. The wafer is masked with photoresist (i.e. photo resist is deposited, selectively exposed using a mask, and selectively removed, using a photolithographic process, leaving portions of the underlying material covered by remaining photo resist while leaving other portions of the underlying material (here the nitride layer 16) exposed. The exposed portions of the nitride layer 16 are selectively etched through openings in the photoresist to expose portions of the underlying polysilicon layer 14. The exposed portions of the polysilicon layer 14 are oxidized using an oxidation process (e.g., thermal oxidation), forming oxide areas 18 on the polysilicon layer 14, as shown in FIG. 1C (after photoresist removal).

A nitride etch is used to remove the remaining portions of nitride layer 16. An anisotropic polysilicon etch is used to remove exposed portions of the polysilicon layer 14, leaving first polysilicon blocks 14a, remaining from polysilicon layer 14, underneath the oxide areas 18 (first polysilicon blocks 14a will constitute the floating gates of the memory cells), as shown in FIG. 1D. An oxide etch is used to remove the exposed portions of oxide layer 12 (i.e., those portions not under the remaining portions of polysilicon layer 14). This etch will cause minor thinning of the oxide areas 18 as well. An oxide layer 20 is then formed over the structure either by deposition (which will cause minor thickening of the oxide areas 18) and/or by oxidation (which has no effect on oxide areas 18). A polysilicon layer is then formed on the structure (i.e., on oxide layer 20 and oxide areas 18). The polysilicon layer is then patterned by forming and patterning photoresist on the polysilicon layer leaving portions of the polysilicon layer exposed. The exposed portions of polysilicon layer are selectively removed by polysilicon etch, leaving second polysilicon blocks 22, as shown in FIG. 1E (after photoresist removal). Insulation spacers 24 are formed on the sides of second polysilicon blocks 22 by insulation material deposition and anisotropic etch, and implantations are performed to form source regions 26 and drain regions 28 in the substrate 10. The final structure is shown in FIG. 1F.

The above technique produces non-volatile memory cells, each with a floating gate 14a formed from the remaining portion of polysilicon layer 14, a control gate in the form of second polysilicon block 22, a source region 26 adjacent an end of the floating gate 14a, and a drain region 28 adjacent an end of the control gate in the form of second polysilicon block 22, with a channel region 10b of the substrate extending between source and drain regions 26/28. The floating gate 14a is positioned over and controls the conductivity of a first portion of the channel region 10b, and the control gate in the form of second polysilicon block 22 is positioned over and controls the conductivity of a second portion of the channel region 10b. There are many advantages of this technique. First, forming oxide areas 18 by oxidation results in the floating gate 14a having a concave top surface, which top surface terminates at the side surface of the floating gate 14a in a sharp edge 14b facing the control gate in the form of second polysilicon block 22, which enhances tunneling performance and efficiency during erase (i.e., an erase operation includes placing a high voltage on the control gate in the form of second polysilicon block 22 to cause electrons to tunnel from the sharp edge 14b of the floating gate 14a, through oxide layer 20, and to the control gate in the form of second polysilicon block 22). The control gate in the form of second polysilicon block 22 has a lower portion vertically over and insulated from the substrate 10 for controlling the conductivity of the channel region 10b therein, and a second portion that extends up and over the floating gate 14a for voltage coupling and proximity to the floating gate sharp edge 14b for erasure. Second, the same oxide layer 20 is used as the word line oxide (i.e., oxide layer portion 20a used to insulate the control gate in the form of second polysilicon block 22 from the substrate 10), as the gap oxide (i.e., oxide layer portion 20b used to insulate the side of the floating gate 14a from the control gate in the form of second polysilicon block 22), and as the tunnel oxide (i.e., oxide layer portion 20c insulating the sharp edge 14b of floating gate 14a from the control gate 22 through which electrons tunnel in the erase operation). Common manufacturing steps for forming the word line oxide 20a, the gap oxide 20b and the tunnel oxide 20c simplifies, expedites and lower the costs of manufacturing.

One drawback of the above described technique is that the thickness of oxide layer 20 must be thick enough to provide the desired performance for the control gate in the form of second polysilicon block 22, while being thin enough to allow tunneling from the floating gate 14a to the control gate in the form of second polysilicon block 22 during an erase operation. Therefore, balancing these considerations, there is a lower limit to the thickness of oxide layer 20 driven by the operational performance of the control gate in the form of second polysilicon block 22, which means the tunnel oxide portion 20c of oxide layer 20 is unnecessarily thick and therefore limits erase performance and efficiency, and limits endurance performance. However, forming the tunnel oxide separately from the word line oxide increases manufacturing complexity, time and costs.

It would be desirable to increase memory cell erase efficiency between the floating gate and the control gate, without adversely affecting the performance of the control gate as a word line, where the same oxide layer is used in both places.

BRIEF SUMMARY OF THE INVENTION

The aforementioned problems and needs are addressed by a method of forming a memory cell, comprising:

forming a first oxide layer on an upper surface of a semiconductor substrate;

forming a first polysilicon block on the first oxide layer, wherein the first polysilicon block includes a top surface and a side surface, and wherein the top surface terminates at the side surface in a sharp edge;

forming a second oxide layer by performing a first oxide deposition, wherein the second oxide layer includes a first portion over the upper surface, a second portion directly on the side surface, and a third portion directly on the sharp edge;

performing an etch that thins the second oxide layer in a non-uniform manner such that the third portion of the second oxide layer is thinner than the first and second portions of the second oxide layer;

performing a second oxide deposition that thickens the first, second and third portions of the second oxide layer, wherein after the second oxide deposition, the third portion of the second oxide layer is thinner than the first and second portions of the second oxide layer;

forming a second polysilicon block having a first portion directly on the first portion of the second oxide layer and a second portion directly on the third portion of the second oxide layer; and forming a source region and a drain region in the semiconductor substrate, which define a channel region of the semiconductor substrate therebetween, wherein the first polysilicon block is disposed over a first portion of the channel region and the first portion of the second polysilicon block is disposed over a second portion of the channel region.

Other objects and features of the present invention will become apparent by a review of the specification, claims and appended figures.

DETAILED DESCRIPTION OF THE INVENTION

The present invention is a technique of forming memory cells where the same oxide layers are used for both the tunnel oxide, the gap oxide and the word line oxide, but the tunnel oxide is thinner than the word line oxide.

Figure 1B:
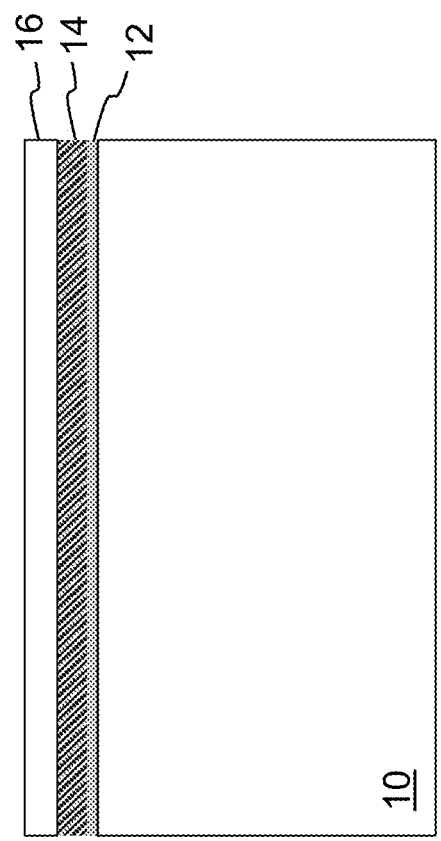
FIGS. 1A-1F are side cross-sectional views illustrating conventional steps for forming memory cells.
Figure 1A:
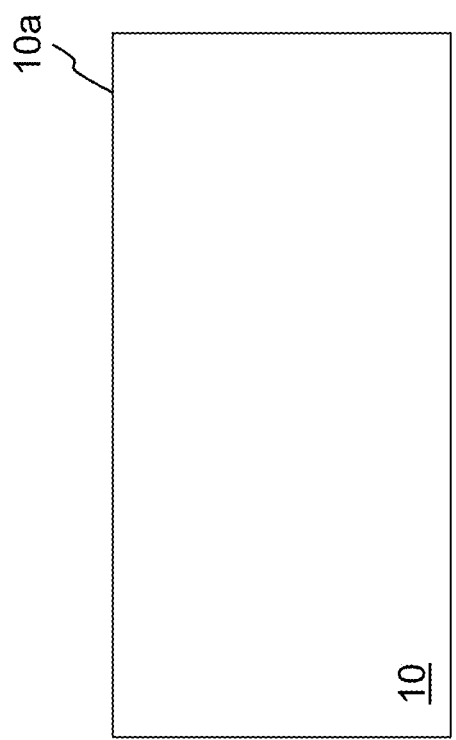
Figure 1D:
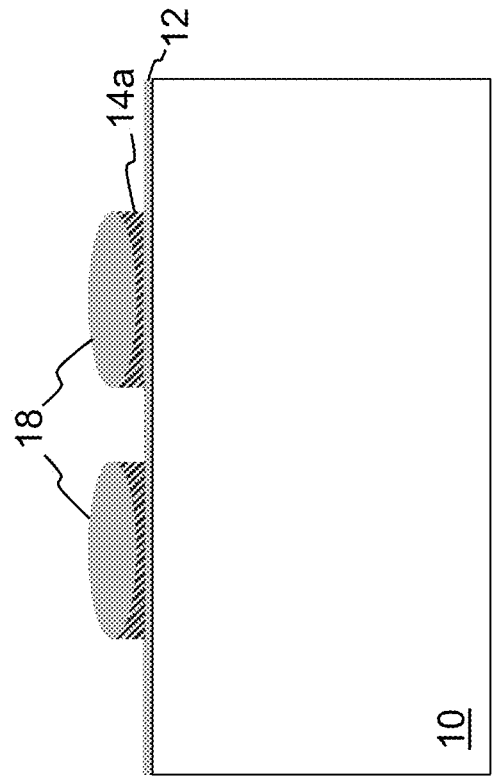
Figure 1C:
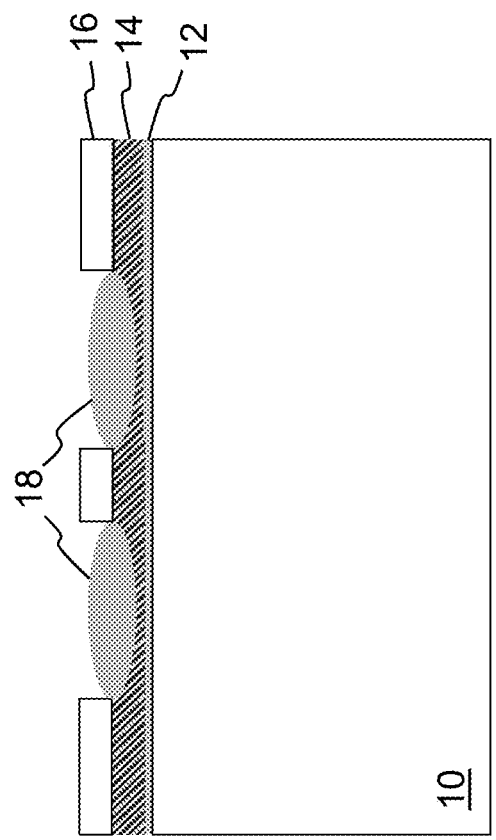
Figure 2A:
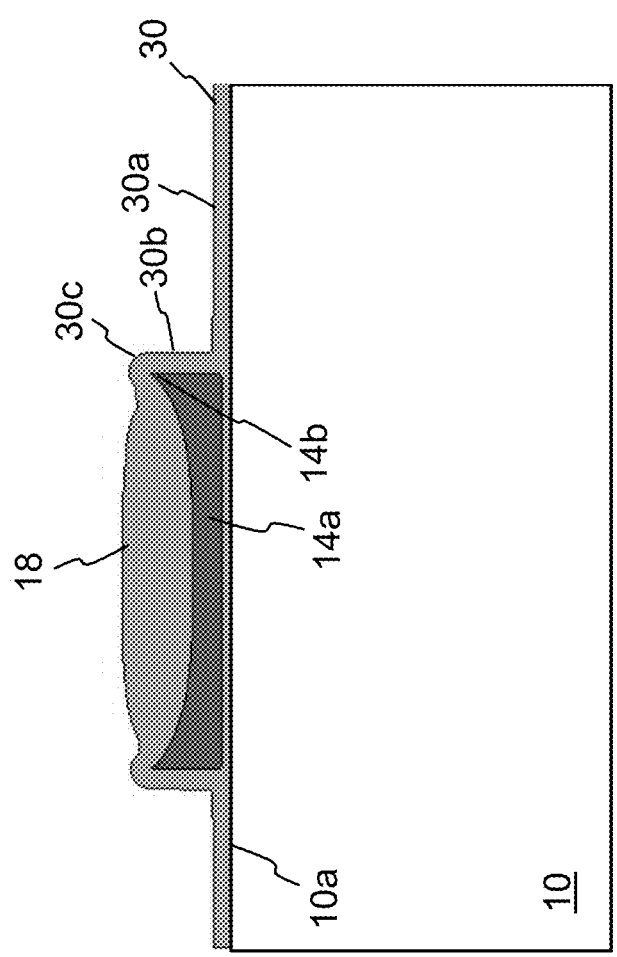
FIGS. 2A-2D are side cross-sectional views illustrating steps for forming memory cells in accordance with the present embodiments.

FIGS. 2A-2D disclose the steps of the method of the present invention. The process begins using the same steps described above with respect to FIGS. 1A-1D. Starting with the structure in FIG. 1D, an oxide etch is used to remove the exposed portions of oxide layer 12 (i.e., those portions not under floating gate 14a—first polysilicon block 14a), and to thin oxide area 18 (as described above). An oxide layer 30 is then formed on the structure by oxide deposition (e.g., high temperature oxide (HTO) deposition), as shown in FIG. 2A (corresponding to the right hand memory cell of FIGS. 1A-1D). Oxide layer 30 includes a first portion 30a (word line portion) over the upper surface, in the present embodiment extending directly on the upper surface 10a of substrate 10, a second portion 30b (gap portion) extending directly on the side of the floating gate 14a, and a third portion 30c (tunnel oxide portion) disposed directly on the sharp edge 14b of floating gate 14a. At this stage, the first, second and third portions 30a, 30b, 30c of oxide layer 30 have approximately the same thickness. Oxide layer 30 further adds to the thickness of thinned oxide area 18.

Figure 2B:
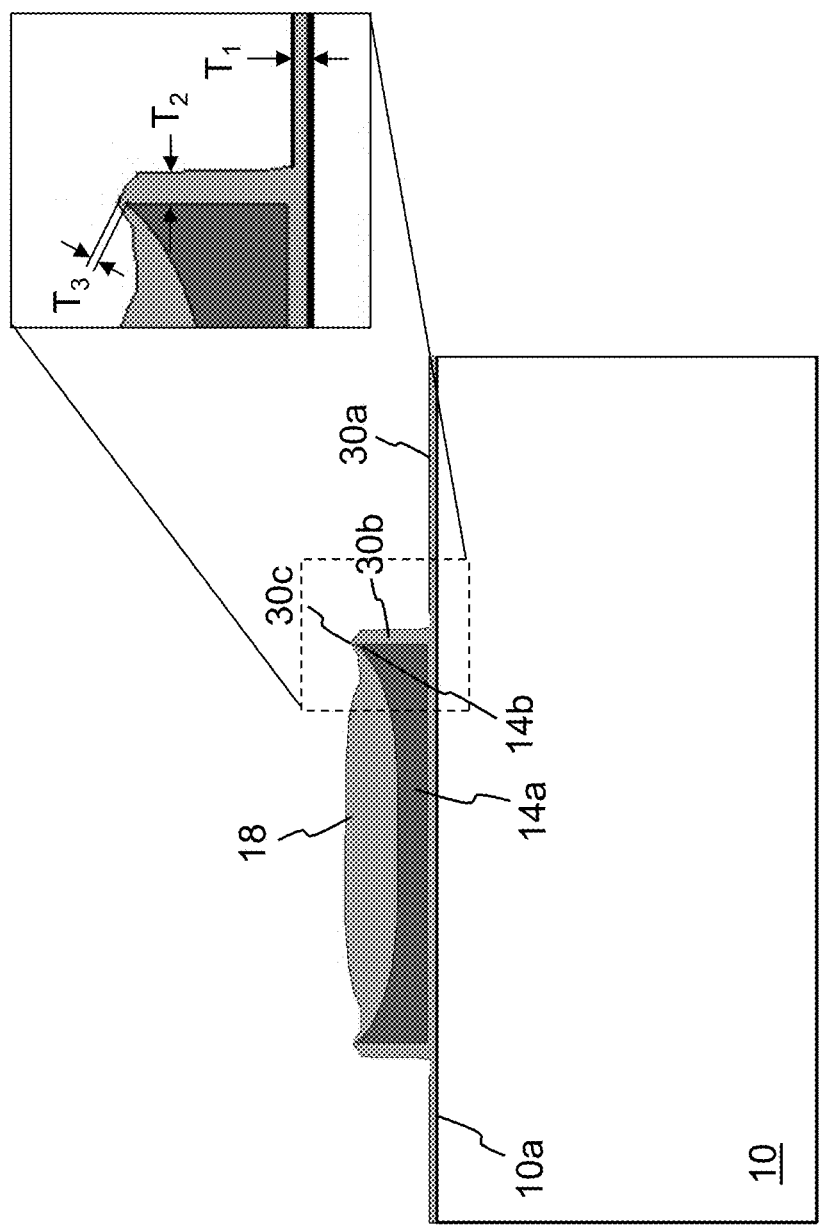

A controlled etch is then performed to thin (i.e., reduce the thickness) of oxide layer 30 in a non-uniform manner. Specifically, it has been discovered that the etch parameters can be selected so that the etch process removes the third portion 30c of the oxide layer 30 at a faster rate than the first and second portions 30a/30b of oxide layer 30, leaving oxide layer third portion 30c thinner than oxide layer first and second portions 30a/30b. Specifically, the radio frequency (RF) power, pressure and gas composition are selected so that the etch rate on oxide layer third portion 30c is greater than that of oxide layer first and second portions 30a/30b. RF power dictates ion bombardment strength, which in turn is related to the electric field. The electric field at the sharp edge 14b is stronger than planar portions of the structure, which can be exploited to accelerate the etch rate at the sharp edge 14b. The RF power used for the etch should be high enough to provide the faster etch rate for oxide layer third portion 30c. An RF power within the range of 150-350 watts has been determined to provide a sufficiently higher etch rate on oxide layer third portion 30c relative to oxide layer first/second portions 30a/30b. Up to about 350 watts, the higher the RF power, the higher the relative etch rate on oxide layer third portion 30c. The pressure used for the etch should be low enough to provide for the faster relative etch rate for oxide layer third portion 30c. An etch pressure within the range of 30-100 millitorr (mTorr) has been determined to provide a sufficiently higher etch rate on oxide layer third portion 30c relative to oxide layer first/second portions 30a/30b. Etch pressures greater than 100 mTorr have been determined to not provide sufficiently higher etch rates for the oxide layer third portion 30c relative to the oxide layer first/second portions 30a/30b. Finally, the etch gas should be clean enough to provide the selective etching without degrading the quality of the remaining oxide layer first/second/third portions 30a/30b/30c after the etch. It has been determined that oxygen and argon, mixed with either carbon tetrafluoride (CF4), nitrogen trifluoride (NF3) or sulfur hexafluoride (SF6), provides good quality etching results. After the controlled etch, the thickness of the oxide layer third portion 30c $T_3$ is less than the thickness $T_1$ of the oxide layer first portion 30a and less than the thickness $T_2$ of the oxide layer second portion 30b, as shown in FIG. 2B. As a non-limiting example, the thickness $T_3$ of the oxide layer third portion 30c can be approximately 25 Å (25 Angstroms) to 35 Å (35 Angstroms) thinner than the thickness $T_1$ of oxide layer first portion 30a.

Figure 2C:
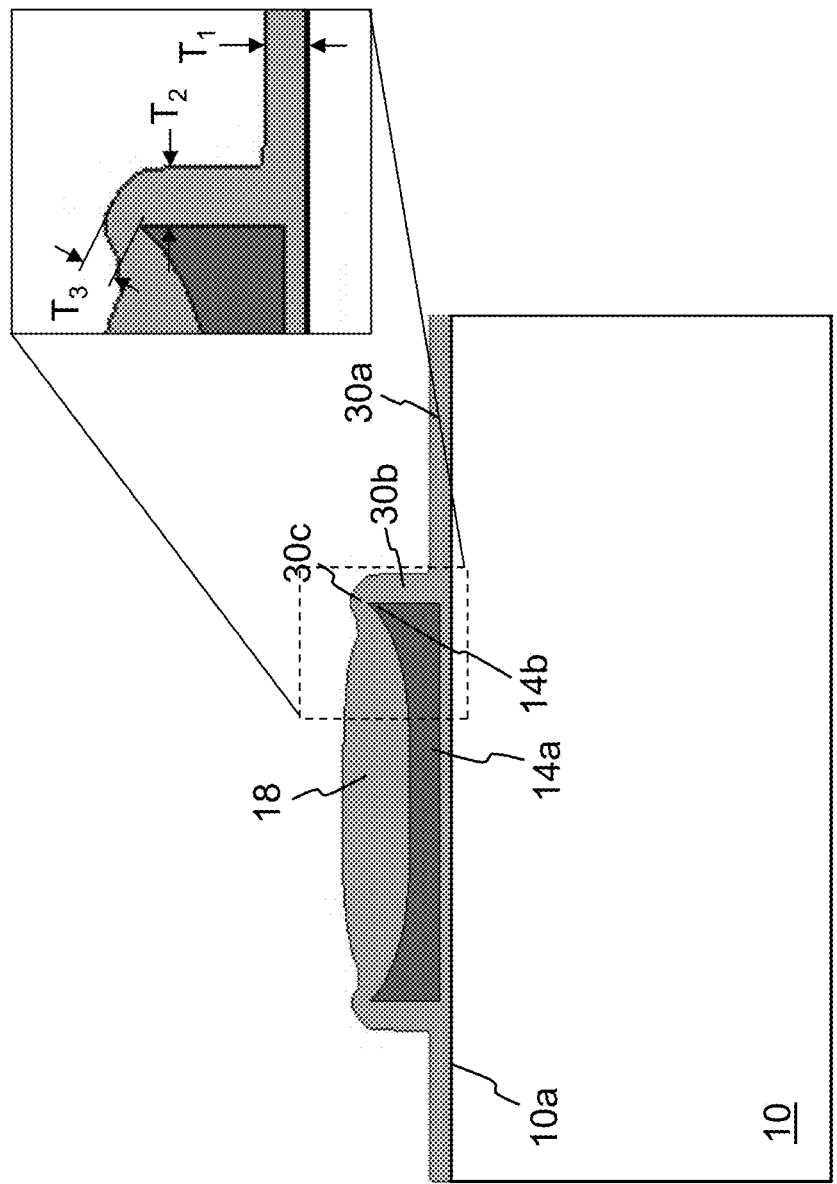
Figure 2D:
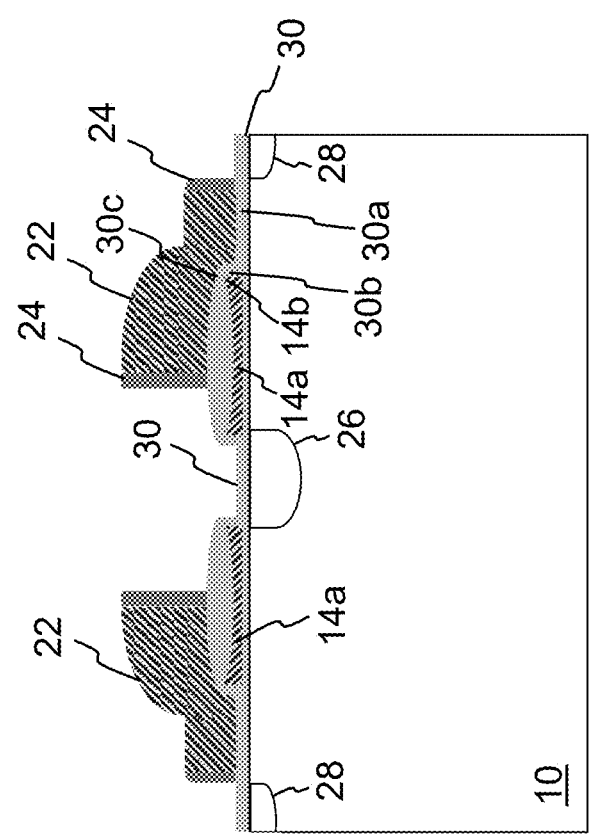

After the controlled etch, a second oxide deposition (e.g., HTO) is performed that thickens (i.e., increases the thickness of) oxide layer first/second/third portions 30a/30b/30c. After the second oxide deposition, the oxide layer third portion 30c is still thinner than oxide layer first and second portions 30a/30b (i.e., the thickness of the oxide layer third portion 30c $T_3$ is less than the thickness $T_1$ of the oxide layer first portion 30a and less than the thickness $T_2$ of the oxide layer second portion 30b), as shown in FIG. 2C. Thickness $T_3$ after the second oxide deposition is the minimum thickness of oxide layer third portion 30c that will separate sharp edge 14b from control gate 22. The second oxide deposition is preferably substantially conformal, thus providing approximately the same final thickness variation between $T_3$ and $T_1$ after the second oxide deposition as before the second oxide deposition for (i.e., as a non-limiting example, after the second oxide deposition, the thickness $T_3$ of the oxide layer third portion 30c can be approximately 25 Å (25 Angstroms) to 35A (35 Angstroms) thinner than the thickness $T_1$ of oxide layer first portion 30a).

Figure 1F:
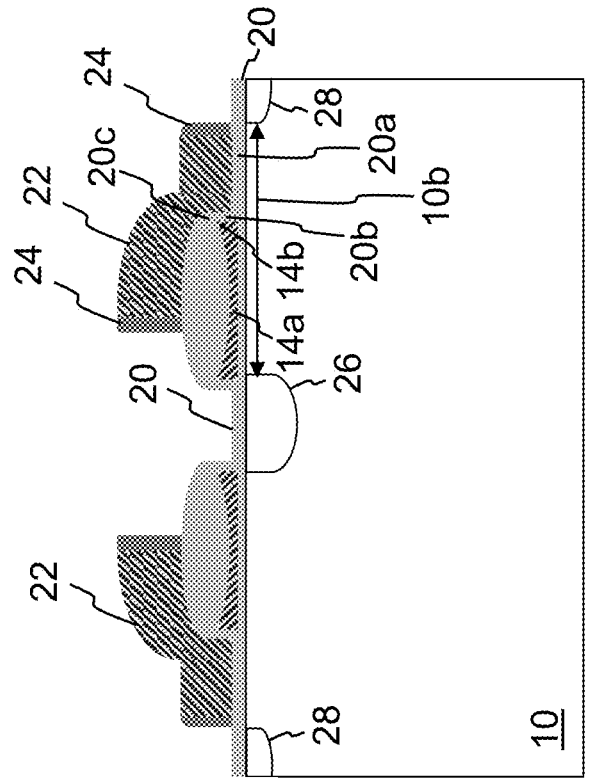
Figure 1E:
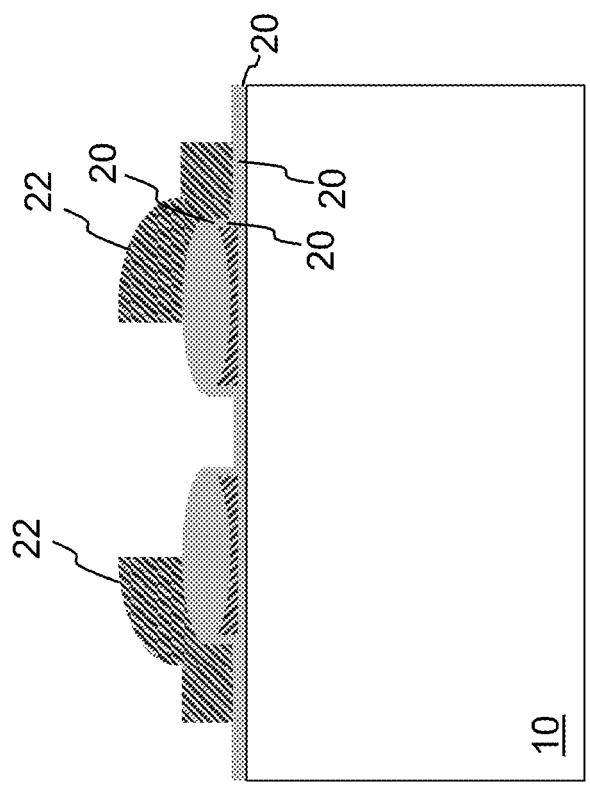

A polysilicon layer deposition and patterning as described above with respect to FIG. 1E is performed to form the control gates formed of second polysilicon blocks 22. Each control gate in the form of second polysilicon block 22 is spaced/insulated from the floating gate sharp edge 14b by the oxide layer third portion 30c, spaced/insulated from the side of the floating gate 14a by the oxide layer second portion 30b, and spaced/insulated from the substrate 10 by oxide layer first portion 30a. In this embodiment, the control gate formed of second polysilicon block 22 has a first portion directly on the oxide layer first portion 30a and a second portion directly on the oxide layer third portion 30c. The remaining steps described above with respect to FIG. 1F are performed to result in the final structure shown in FIG. 2D (showing a pair of memory cells, the right hand memory cell including the floating gate 14 and the oxide layer portions 30a/30b/30c of FIG. 2C).

The above described fabrication method results in a memory cell that includes an oxide layer third portion 30c of reduced thickness separating and insulating the sharp edge 14b of floating gate 14a from the control gate 22, for enhanced erase efficiency because electrons can more easily tunnel through the oxide layer third portion 30c given its reduced thickness. The reduced thickness of oxide layer third portion 30c also reduces trap-up rates and increases endurance. The oxide layer second portion 30b separating and insulating the side of the floating gate 14a from the control gate in the form of second polysilicon block 22 is thicker than oxide layer third portion 30c, to reduce adverse disturb effects during operation and provide better isolation between the floating gate 14a and the control gate in the form of second polysilicon block 22. The oxide layer first portion 30a separating and insulating the control gate in the form of second polysilicon block 22 from the substrate 10 is also thicker than oxide layer third portion 30c, for better operational performance of the control gate in the form of second polysilicon block 22.

Preferably, but not necessarily, oxide layer second portion 30b can have a thickness greater than that of oxide layer first portion 30a (e.g., the thickness $T_2$ of the oxide layer second portion 30b is greater than the thickness $T_1$ of the oxide layer first portion 30a), which can provide improved data retention performance. This can be achieved because the controlled etch targets the horizontally oriented oxide layer first portion 30a at a greater rate than the vertically oriented oxide layer second portion 30b. It should be noted that conformal oxide deposition techniques for the first and second oxide depositions need not be perfectly conformal, but can have a small variation between vertical and horizontal surfaces (e.g., as a non-limiting example, an HTO deposition can be performed such that the thickness of oxide deposited on vertical surfaces is 15% thinner than the oxide deposited on horizontal surfaces). This means that the first and second oxide depositions by themselves would result in oxide layer second portion 30b being thinner than the oxide layer first portion 30a. However, the controlled etch can more than compensate for this oxide deposition variation, so that after the second oxide deposition, the total thickness $T_2$ of oxide layer second portion 30b is thicker than the total thickness $T_1$ of the oxide layer first portion.

Other advantages of the above described fabrication method include the fact that the quality of the oxide layer first/second/third portions 30a/30b/30c is improved by forming them using two oxide depositions. For example, any pin holes, micro-trenches, undercuts or other aberrations caused by the controlled etch to the oxide layer 30 are filled in or otherwise removed by the second oxide deposition used to thicken oxide layer 30.

Figure 3A:
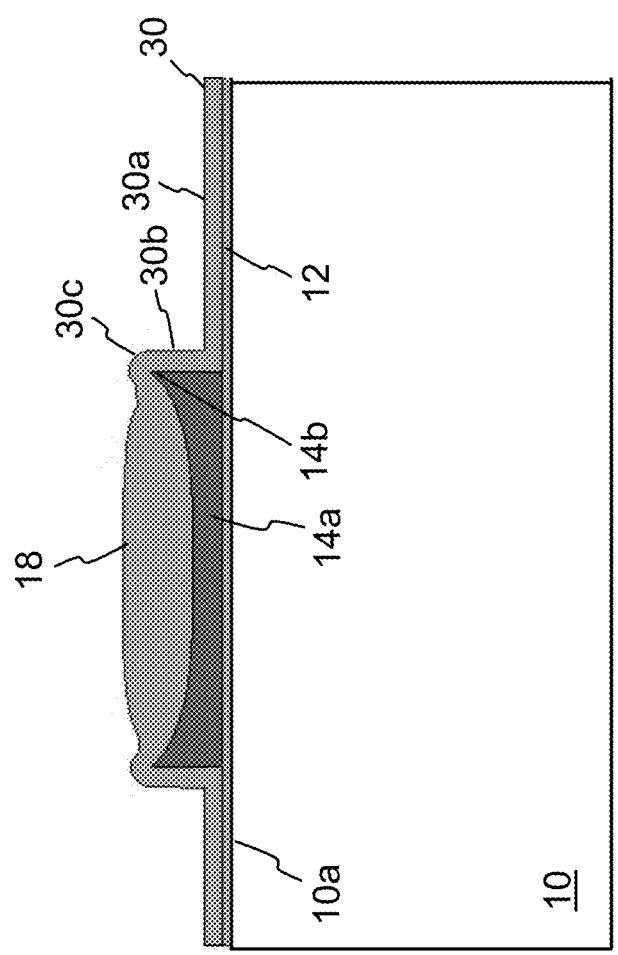
FIGS. 3A-3B are side cross-sectional views illustrating steps for forming memory cells in accordance with an alternate embodiment of the present embodiments.
Figure 3B:
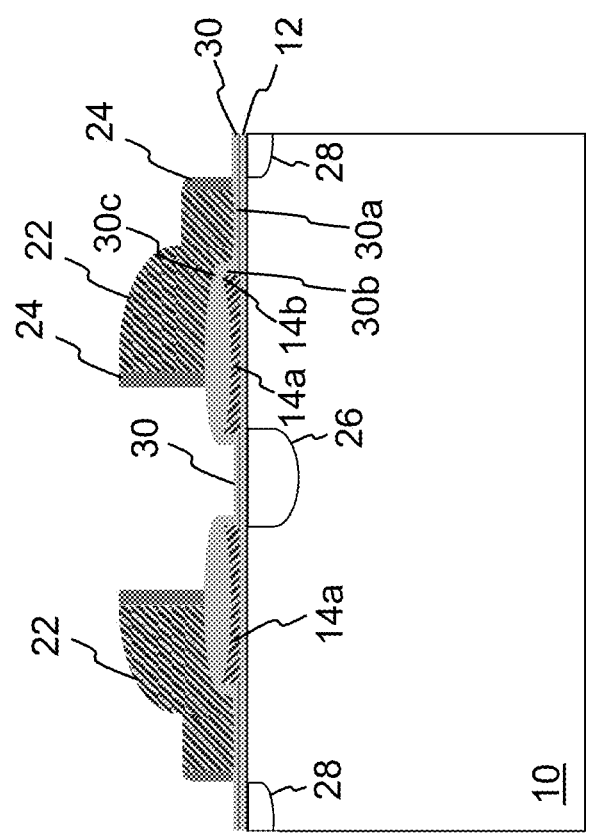

FIGS. 3A-3B disclose the steps of the method of an alternate embodiment of the present invention. The process begins using the same steps described above with respect to FIGS. 1A-1D. Starting with the structure in FIG. 1D and focusing on the right hand memory cell, the oxide layer 30 is then formed on the structure by oxide deposition (e.g., high temperature oxide (HTO) deposition), as shown in FIG. 3A. This alternate embodiment differs from the previously described embodiment in that the oxide etch used to remove the exposed portions of oxide layer 12 (as shown in FIG. 2A) is omitted. Therefore, the oxide layer first portion 30a of oxide layer 30 is formed on oxide layer 12 (i.e., over but not directly on substrate surface 10a), resulting in a thicker total oxide on substrate surface 10a, as shown in FIG. 3A. Optionally, a wet cleaning or dip can be performed to even out oxide thickness before and/or after the deposition of oxide layer 30. The same steps described above with respect to FIGS. 2B-2D are then performed (controlled oxide etch, second oxide deposition, polysilicon layer deposition and patterning, spacer formation, source/drain implantations) to the structure of FIG. 3A, resulting in the final structure shown in FIG. 3B. The structure in FIG. 3B is essentially the same as that in FIG. 2D, except the oxide under the control gate 22 is a combination of oxide layer 12 and oxide layer third portion 30a of oxide layer 30. By leaving oxide layer 12 in this portion of the structure can allow for further thinning of oxide layer portion 30c (i.e., a greater relative thickness difference between the oxide layer third portion 30c and the total oxide thickness under the control gate in the form of second polysilicon block 22, i.e. the total thickness of oxide layer 12 and first portion 30a (together forming the word line portion)).

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A method of forming a memory cell, comprising:
   forming a first oxide layer on an upper surface of a semiconductor substrate;
   forming a first polysilicon block on the first oxide layer, wherein the first polysilicon block includes a top surface and a side surface, and wherein the top surface terminates at the side surface in a sharp edge;
   forming a second oxide layer by performing a first oxide deposition, wherein the second oxide layer includes a first portion over the upper surface, a second portion directly on the side surface, and a third portion directly on the sharp edge;
   performing an etch that thins the second oxide layer in a non-uniform manner such that the third portion of the second oxide layer is thinner than the first and second portions of the second oxide layer;
   performing a second oxide deposition that thickens the first, second and third portions of the second oxide layer, wherein after the second oxide deposition, the third portion of the second oxide layer is thinner than the first and second portions of the second oxide layer;
   forming a second polysilicon block having a first portion directly on the first portion of the second oxide layer and a second portion directly on the third portion of the second oxide layer; and
   forming a source region and a drain region in the semiconductor substrate, which define a channel region of the semiconductor substrate therebetween, wherein the first polysilicon block is disposed over a first portion of the channel region and the first portion of the second polysilicon block is disposed over a second portion of the channel region.

2. The method of claim 1, wherein after the performing the second oxide deposition, the third portion of the second oxide layer has a thickness that is approximately 25 Angstroms to 35 Angstroms less than a thickness of the first portion of the second oxide layer.

3. The method of claim 1, wherein after the second oxide deposition, the second portion of the second oxide layer is thicker than the first portion of the second oxide layer.

4. The method of claim 1, wherein the top surface of the first polysilicon block is concave.

5. The method of claim 1, wherein the forming a first polysilicon block includes oxidizing the top surface of the first polysilicon block such that the top surface is concave.

6. The method of claim 1, wherein the forming of the second oxide layer includes forming the first portion of the second oxide layer directly on the first oxide layer.

7. The method of claim 1, further comprising:
   removing a portion of the first oxide layer which is adjacent to the side surface of the first polysilicon block and not underneath the first polysilicon block, wherein the forming of the second oxide layer includes forming the first portion of the second oxide layer directly on the upper surface.

8. The method of claim 1, wherein the performing the etch comprises using an etch radio frequency power between approximately 150 watts and 350 watts.

9. The method of claim 1, wherein the performing the etch comprises using an etch pressure between approximately 30 millitorr and 100 millitorr.

10. The method of claim 1, wherein the performing the etch comprises using etch gasses that include oxygen and argon, together with carbon tetrafluoride (CF4), nitrogen trifluoride (NF3) or sulfur hexafluoride (SF6).

11. The method of claim 1, wherein the performing the etch comprises using an etch radio frequency power between approximately 150 watts and 350 watts, and using an etch pressure between approximately 30 millitorr and 100 millitorr, and using etch gasses that include oxygen and argon, together with carbon tetrafluoride (CF4), nitrogen trifluoride (NF3) or sulfur hexafluoride (SF6).

* * * * *